(12) United States Patent
Yu

(10) Patent No.: US 6,670,245 B2
(45) Date of Patent: Dec. 30, 2003

(54) METHOD FOR FABRICATING AN ESD DEVICE

(75) Inventor: Ta-Lee Yu, Hsinchu Hsien (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 09/974,797

(22) Filed: Oct. 12, 2001

(65) Prior Publication Data

US 2003/0032220 A1 Feb. 13, 2003

(30) Foreign Application Priority Data

Aug. 8, 2001 (TW) ........................... 90119366 A

(51) Int. Cl.[7] .......................................... H01L 21/8234
(52) U.S. Cl. ........................................ 438/275; 438/521
(58) Field of Search .................................. 438/154, 188, 438/199, 257, 275, 521, 529, 519

(56) References Cited

U.S. PATENT DOCUMENTS

| | | | | |
|---|---|---|---|---|
| 5,789,784 A | * | 8/1998 | Chang et al. | 257/356 |
| 5,953,601 A | * | 9/1999 | Shiue et al. | 438/200 |
| 5,966,599 A | * | 10/1999 | Walker et al. | 438/228 |
| 6,169,001 B1 | * | 1/2001 | Lin et al. | 438/294 |
| 6,329,253 B1 | * | 12/2001 | Song et al. | 438/281 |

FOREIGN PATENT DOCUMENTS

JP    06-053420    *    3/1993    .......... H01L/27/06

* cited by examiner

*Primary Examiner*—Amir Zarabian
*Assistant Examiner*—Pamela E Perkins
(74) *Attorney, Agent, or Firm*—Birch, Stewart, Kolasch & Birch, LLP

(57) ABSTRACT

The present invention provides a method for fabricating an ESD device. First, a substrate undergoes first implantation to form a first first-type well comprising an electrostatic discharge region. Next, second implantation is performed on the substrate and the electrostatic discharge region to form a second first-type well and an ESD device. Finally, gates, sources, and drains are formed to complete the process.

22 Claims, 4 Drawing Sheets

METHOD FOR FABRICATING AN ESD DEVICE

BACKGROUND OF THE INVENTION

1. Field of the Invention

The present invention relates in general to an ESD device. In particular, the present invention relates to a method of forming an ESD device in a high votage while implanting ions in a low voltage well to decrease the breakdown voltage of the transistor comprising the high votage well.

2. Description of the Related Art

Electrostatic discharge (ESD) is a common phenomenon that occurs during handling of semiconductor integrated circuit (IC) devices. Electrostatic charges may accumulate and cause potentially destructive effects on an IC device. ESD stress can typically occur during a testing phase of IC fabrication, during installation of the IC onto a circuit board, as well as during use of equipment into which the IC has been installed. Damage to a single IC due to poor ESD protection in an electronic device can partially or sometimes completely hamper its operation.

There are several ESD stress models based on the reproduction of typical discharge pulses to which the IC may be exposed during manufacturing or handling. Three standards models, known as the Human Body Model (HBM), Machine Model (MM), and Charged Device Model (CDM) have been proposed. The human-body model is set forth in U.S. Military Standard MIL-STD-883, Method 3015.6. The military standard models the electrostatic stress produced on an IC device when a human carrying electrostatic charges touches the lead pins of the IC device. The machine model is set forth in Industry Standard EIAJ-IC-121, which describes the electrostatic stress produced on an IC device when a machine carrying electric charges contacts the lead pins of the IC device. The charged device model describes the ESD current generated when an IC already carrying electric charges is grounded while being handled.

FIG. 1 is a block diagram according to a conventional ESD device.

The semiconductor device comprises an internal circuit 30 and I/O pad 10, and an ESD device 20 is setup between the internal circuit 30 and pad 10 to prevent ESD event.

ESD device 20 comprises MOS transistors, such as PMOS, NMOS, and CMOS transistors. FIG. 2 is a cross section of an NMOS transistor. The gate 21 and source 22 are connected to ground. Therefore, the NMOS transistor 25 is not turned on in normal operation. When ESD occurs, the built-in parasitic NPN bipolar transistor 26 in the NMOS transistor turns on the protect internal circuit 30. The source 22 constructs the emitter of the built-in parasitc NPN bipolar transistor 26, the drain 23 constructs the collector of the built-in parasitic NPN bipolar transistor 26, and the P-type substrate 24 constructs the base of the built-in parasitc NPN bipolar transistor 26.

FIGS. 3A–3C are cross sections of a conventional ESD protection device. In FIG. 3A, substrate 40 comprises an I/O device region 40A and core device region 40B. I/O device region 40A receives higher voltage power, which is about from 3V to 6V, and core device region 40B receives lower voltage power, about from 0.8V to 1.5V. In FIG. 3B, I/O device region 40A and core device region 40B are implanted with P-type ions to form P-type well 42A and 42B, respectively. Because the power provided to the I/O device region 40A and core device region 40B are different, the doped concentration in the I/O device region 40A and core device region 40B are different. Consequently, two masks are required to dope different ion concentration in the I/O device region 40A and core device region 40B.

Next, I/O device region 40A, core device region 40B and their active areas are separated by shallow trench isolation or field insulator formed by LOCOS. Subsequent steps comprise thermal growing gate oxide layers 44A and 44B, depositing thereon a polysilicon or polycide gate layer, and then patterning the latter layer to form gate electrodes 46A and 46B for each device consisting of a gate oxide and a gate. Then using the gate 46A and 46B as masks, doped regions 48A, 481A and 48B are formed by performing ion implantation. A drive-in step is then used by heating to between about 20 to 50 minutes with the resultant lightly doped drain (LDD) structure being formed under spacers 49A and 49B as is well known in the art.

Next, an extra masking step is used to pattern the ESD devices 52A. An implant is performed, through contact opening 53 into the active regions of the ESD protection device, then N-type doped region 52A is formed. The implant has the effect of reducing the junction breakdown voltage.

After the ESD implant, the photoresist layer is removed from the substrate. Then self-aligned silicides 56A and 56B are formed over the source/drain regions 48A and 48B, and gate 46A and 46B. It is preferred that the silicides 56A and 56B are formed by silicidation of tungsten from tungsten silicide.

However, the additional masks and implantation are used while forming the ESD protection device, which will increase the cost of the process and complicate the fabricating process.

SUMMARY OF THE INVENTION

The object of the present invention is to provide a method for fabricating an ESD device with dual voltage process. The low voltage well is implanted with ions to form an ESD device when the high voltage well is implanted with ions. Therefore, the ESD device having doped concentration higher than that of low voltage well is formed without adding another mask and ion implantation to decrease the cost and the complexity of the process.

To achieve the above-mentioned object, the present invention provides a method for fabricating an ESD device, which comprises the following steps. First, a substrate undergoes first ion implantation to form a first first-type well comprising an electrostatic discharge region. Next, a second implantation is performed on the substrate and the electrostatic discharge region to form a second first-type well and an ESD device. Finally, gates, sources, and drains are formed to complete the process.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

Figure 1:
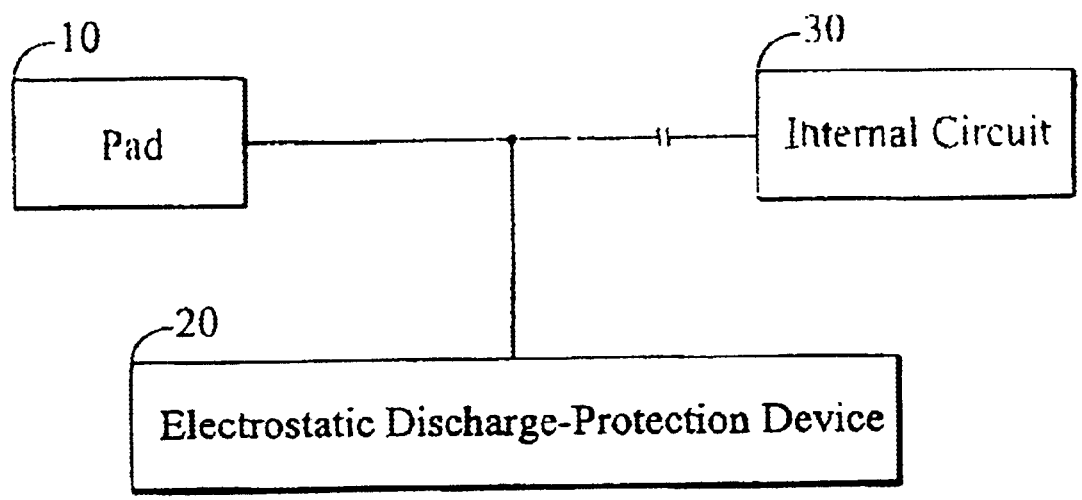
FIG. 1 is a block diagram of a conventional ESD device.
Figure 2:
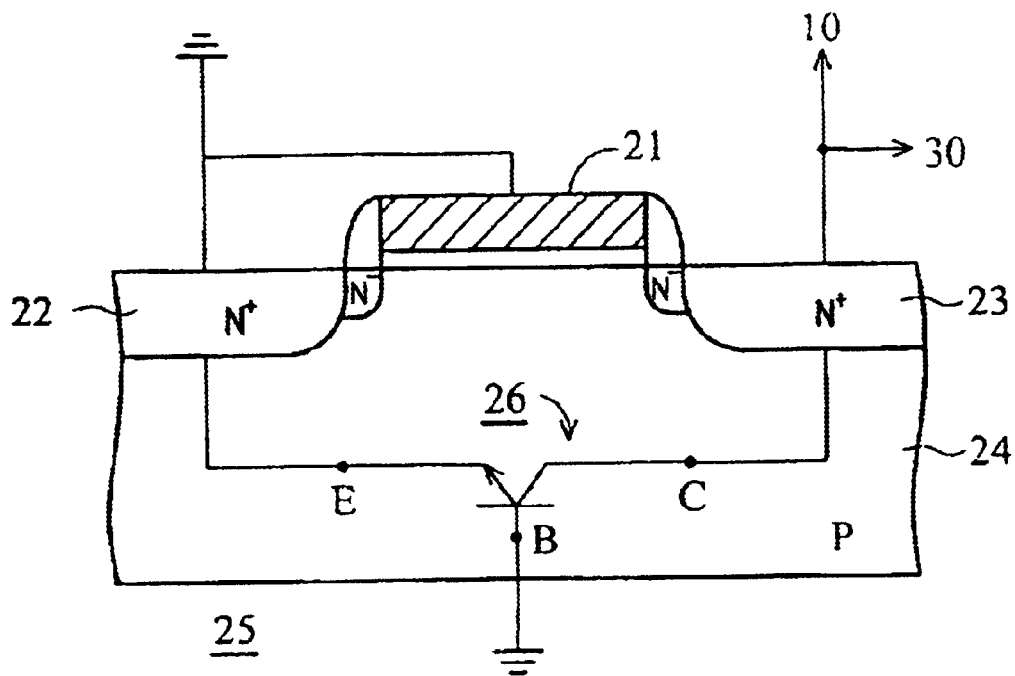
FIG. 2 is a cross section of a conventional NMOS transistor.
Figure 3A:
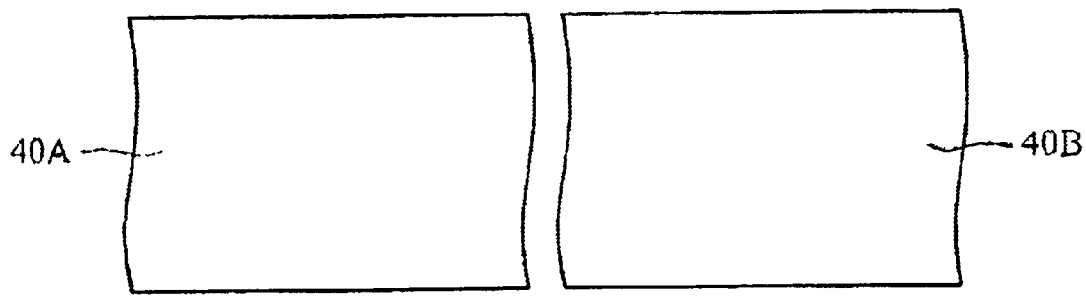
FIGS. 3A–3C are cross sections of a conventional ESD protection device.
Figure 3B:
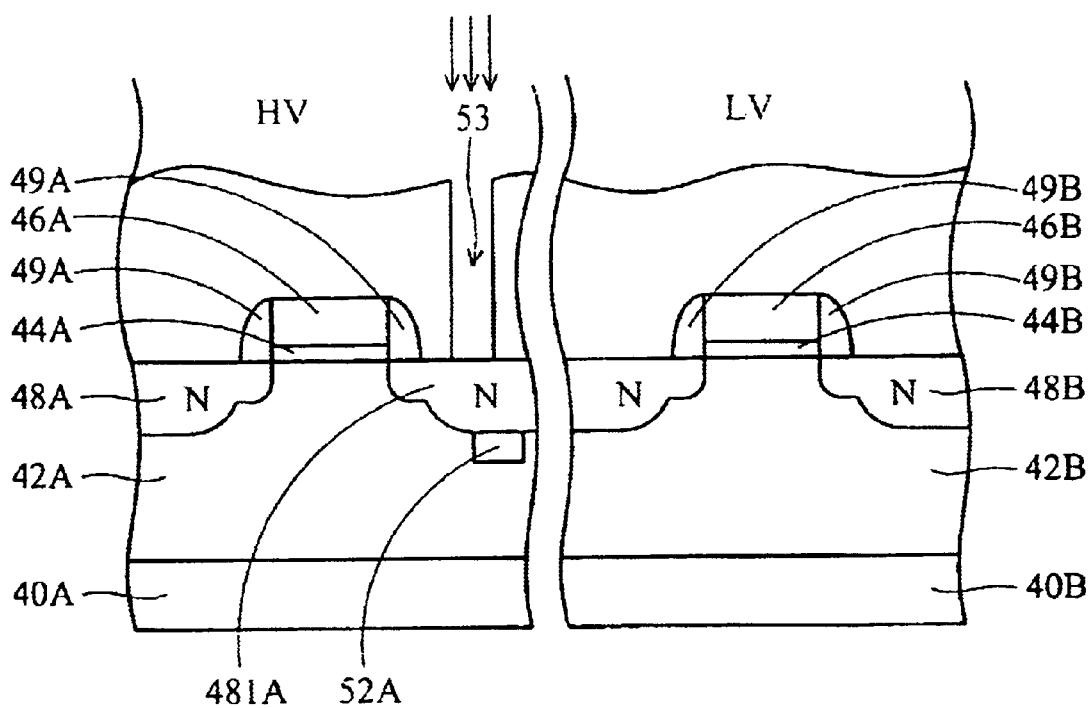
Figure 3C:
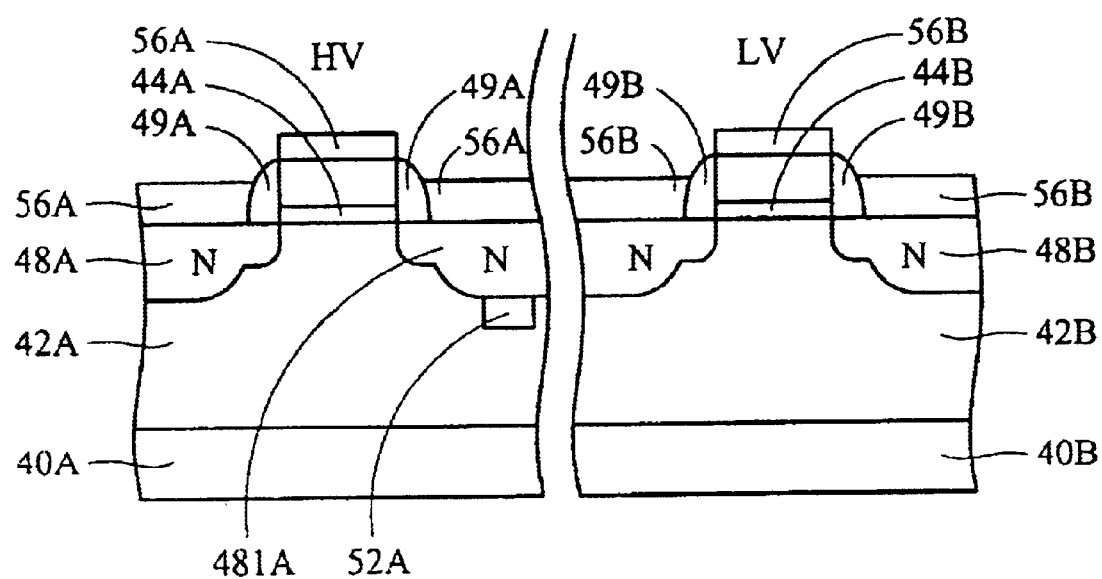
Figure 4A:
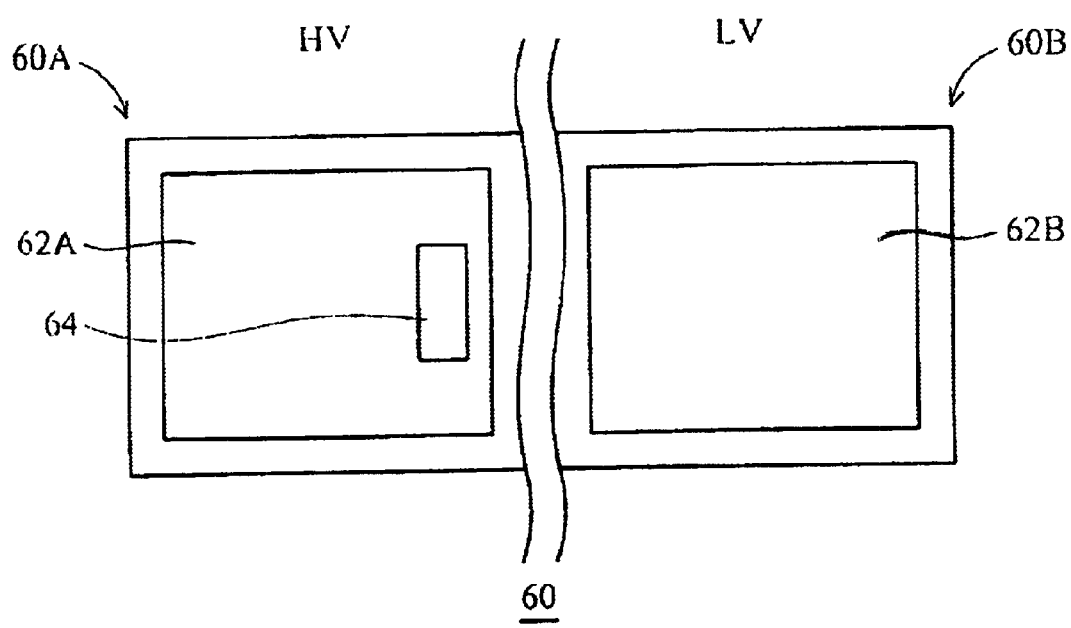
FIG. 4A is a top view of a substrate comprising an ESD device according to the embodiment of the present invention.
Figure 4B:
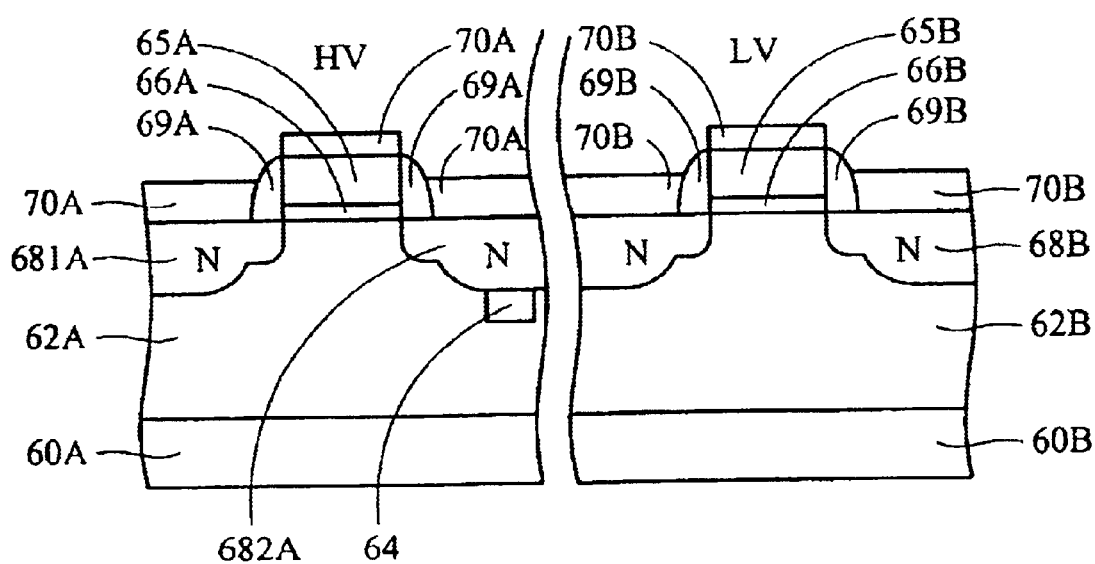
FIG. 4B is a cross section of a substrate comprising an ESD device according to the embodiment of the present invention.

FIG. 4A is a top view of a substrate comprising an ESD device according to the embodiment of the present invention. FIG. 4B is a cross section of a substrate comprising an ESD device according to the embodiment of the present invention.

The substrate 60 comprises an I/O device region 60A and core device region 60B. The I/O device region 60A receives higher voltage, about from 3V to 6V, and core device region 60B receives lower voltage, about from 0.8V to 1.5V. The I/O device region 60A is implanted with P-type ions to form P-type well 62A (boron for example). In the present embodiment, the dosage of the implanting of boron ions in the I/O device region 60A is between about 1e12 atom/cm$^2$ to 6e13 atom/cm$^2$.

Next, the core device region 60B is implanted with P-type boron ions to form P-type well 62B. At the same time, the I/O device region 60A is implanted with P-type ions to form a doped region 64, wherein the doped region 64 is an electrostatic discharge device. In this step, the dosage of the implanting of boron ions is between about 1e12 atom/cm$^2$ to 6e13 atom/cm$^2$.

Because the power levels provided to the I/O device region 60A and the core device region 60B are different, the doped concentration in the I/O device region 60A and core device region 60B are different, dependent upon the requirement of each process.

As mentioned above, the doped region 64 in the P-type well 62A is implanted with ions two times, one implantation during formation of the P-type well 62A, and the other during formation of the P-type well 62B. Therefore, the doped concentration of the doped region 64 is higher than P-type well 62A, which is between about 1e17 atom/cm$^3$ to 9e18 atom/cm$^3$. In addition, the doped concentration of the doped region 64 depends on the doped concentration of the P-type well 62A and P-type well 62B. In other words, the doped concentration of the doped region 64 is about equal to the sum of the doped concentration of the P-type well 62A and P-type well 62B. In the present embodiment, the doped concentration of the P-type well 62A and P-type well 62B are between about 1e16 atom/cm$^3$ to 5e18 atom/cm$^3$.

As shown in FIG. 4B, the I/O device region 60A, the core device region 60B and their active areas are separated by shallow trench isolation or field insulator formed by LOCOS. Subsequent steps comprise thermal growing gate oxide layers 66A and 66B, depositing thereon a polysilicon or polycide gate layer, and then patterning the latter layer to form gate electrodes 65A and 65B for each device consisting of a gate oxide and a gate. Then using the gates 65A and 65B as masks, N-type doped regions 681A, 682A and 68B are formed by performing ion implantation, wherein the N-type doped region 682A is formed on the P-type doped region 64.

As mentioned above, the doped concentration of the P-type doped region 64 is hagher than P-type well 64A, so the breakdown voltage of the PN junction between N-type doped region 682A and the P-type doped region 64 is decreased. Therefore, the PN junction between N-type doped region 682A and the P-type doped region 64 will be turned on in advance to discharge ESD current to protect the core device region 60B.

Next, spacers 65A and 65B are formed next to the sidewalls of the gates 65A and 65B. A drive-in step is then used by heating to between about 20 to 50 minutes with the resultant lightly doped drain (LDD) structure formed under spacers 69A and 69B as is well known in the art.

Next, self-aligned silicides 70A and 70B are formed over the source/drain regions 681A, 682A, and 68B, and gates 65A and 65B. It is preferred that the silicides 70A and 70B are formed by silicidation of tungsten to result in tungsten silicide. Then, an interlevel dielectric layer is deposited on the substrate and the silicide contact, and holes are formed in the interlevel dielectric layer. Finally, metal is deposited in the holes to complete the process.

According to the present embodiment, the ESD device is formed in the specific region in the P-type well 62A when the P-type well 62B is implanted with ions. Compared to the prior art, the present invention performs fewer ion implantations and uses fewer masks than the prior art. Thus, the cost and complexity of process is reduced.

Moreover, the method disclosed in the present embodiment comprises the low voltage well being implanted with ions to form an ESD device when the high voltage well is implanted with ions. However, the position of the ESD device is not limited in the low voltage well. The present invention may be applied to situations in which the ESD device is set up in the high voltage well.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating an ESD device, comprising the following steps:

providing a substrate;

first implanting of ions in the substrate to form a first first-type well comprising an electrostatic discharge region;

second implanting of ions in the substrate and the electrostatic discharge region to form a second first-type well and an ESD device; and forming a first gate, a first source, and a first drain coupled to the ESD device on the first first-type well, and a second gate, a second source, and a second drain on the second first-type well.

2. The method for fabricating an ESD device as claimed in claim 1, wherein the substrate is a silicon substrate.

3. The method for fabricating an ESD device as claimed in claim 2, wherein the first first-type well and the second first-type well are P-type wells.

4. The method for fabricating an ESD device as claimed in claim 3, wherein the ions of the first implanting and the second implanting are boron ions.

5. The method for fabricating an ESD device as claimed in claim 4, wherein the doped concentration of the electrostatic discharge region is higher than the doped concentration of the first first-type well and the second first-type well.

6. The method for fabricating an ESD device as claimed in claim 5, wherein the doped concentration of the electrostatic discharge region is about equal to the sum of the doped concentration of the first first-type well and the second first-type well.

7. The method for fabricating an ESD device as claimed in claim 6, wherein the doped concentration of the boron ions in the ESD device is between about 1e17 atom/cm$^3$ to 9e18 atom/cm$^3$.

8. The method for fabricating an ESD device as claimed in claim 6, wherein the doped concentration of the boron ions in the first first-type well is between about 1e16 atom/cm$^3$ to 5e18 atom/cm$^3$.

9. The method for fabricating an ESD device as claimed in claim 6, wherein the doped concentration of the boron ions in the second first-type well is between about 1e16 atom/cm$^3$ to 5e18 atom/cm$^3$.

10. The method for fabricating an ESD device as claimed in claim 9, wherein the dosage of the first implanting of ions is between about 1e12 atom/cm$^2$ to 6e13 atom/cm$^2$.

11. The method for fabricating an ESD device as claimed in claim 10, wherein the dosage of the second implanting of ions is between about 1e12 atom/cm$^2$ to 6e13 atom/cm$^2$.

12. A method for fabricating an ESD device, comprising the following steps:

providing a substrate;

first implanting of ions in the substrate to form a first first-type well comprising an electrostatic discharge region;

second implanting of ions in the substrate and the electrostatic discharge region to form a second first-type well and an ESD device; and forming a first gate, a first source, and a first drain coupled to the ESD device on the first first-type well, and a second gate, a second source, and a second drain on the second first-type well;

forming salicide contact over the first gate, the first source, the first drain, the second gate, the second source, and the second drain;

depositing interlevel dielectric layer on the substrate and the salicide contact;

forming holes in the interlevel dielectric layer; and depositing metal in the holes.

13. The method for fabricating an ESD device as claimed in claim 12, wherein the substrate is a silicon substrate.

14. The method for fabricating an ESD device as claimed in claim 13, wherein the first first-type well and the second first-type well are P-type wells.

15. The method for fabricating an ESD device as claimed in claim 14, wherein the ions of the first implanting and the second implanting are boron ions.

16. The method for fabricating an ESD device as claimed in claim 15, wherein the doped concentration of the electrostatic discharge region is higher than the doped concentration of the first first-type well and the second first-type well.

17. The method for fabricating an ESD device as claimed in claim 16, wherein the doped concentration of the electrostatic discharge region is about equal to the sum of the doped concentration of the first first-type well and the second first-type well.

18. The method for fabricating an ESD device as claimed in claim 17, wherein the doped concentration of the boron ions in the ESD device is between about 1e17 atom/cm$^3$ to 9e18 atom/cm$^3$.

19. The method for fabricating an ESD device as claimed in claim 18, wherein the doped concentration of the boron ions in the first first-type well is between about 1e16 atom/cm$^3$ to 5e18 atom/cm$^3$.

20. The method for fabricating an ESD device as claimed in claim 19, wherein the doped concentration of the boron ions in the second first-type well is between about 1e16 atom/cm$^3$ to 5e18 atom/cm$^3$.

21. The method for fabricating an ESD device as claimed in claim 20, wherein the dosage of the first implanting of ions is between about 1e12 atom/cm$^2$ to 6e13 atom/cm$^2$.

22. The method for fabricating an ESD device as claimed in claim 21, wherein the dosage of the second implanting of ions is between about 1e12 atom/cm$^2$ to 6e13 atom/cm$^2$.

* * * * *